US011935721B2

(12) United States Patent
Zeidler et al.

(10) Patent No.: US 11,935,721 B2
(45) Date of Patent: Mar. 19, 2024

(54) SYSTEM COMPRISING A MULTI-BEAM PARTICLE MICROSCOPE AND METHOD FOR OPERATING THE SAME

(71) Applicant: Carl Zeiss MultiSEM GmbH, Oberkochen (DE)

(72) Inventors: Dirk Zeidler, Oberkochen (DE); Nico Kaemmer, Koenigsbronn (DE); Christian Crueger, Gerstetten (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 225 days.

(21) Appl. No.: 17/374,494

(22) Filed: Jul. 13, 2021

(65) Prior Publication Data

US 2021/0343499 A1    Nov. 4, 2021

Related U.S. Application Data

(63) Continuation of application No. PCT/EP2020/000012, filed on Jan. 14, 2020.

(30) Foreign Application Priority Data

Jan. 24, 2019    (DE) .......................... 102019000470

(51) Int. Cl.
*H01J 37/28* (2006.01)
*H01J 37/26* (2006.01)

(52) U.S. Cl.
CPC ............ *H01J 37/28* (2013.01); *H01J 37/265* (2013.01); *H01J 2237/2602* (2013.01); *H01J 2237/2803* (2013.01)

(58) Field of Classification Search
CPC .. H01J 37/00; H01J 37/26; H01J 37/28; H01J 37/02; H01J 37/222; H01J 2237/2602; H01J 2237/2803; H01J 2237/226
(Continued)

(56) References Cited

U.S. PATENT DOCUMENTS

| 4,130,761 A | 12/1978 | Matsuda |
| 4,153,843 A | 5/1979 | Pease |

(Continued)

FOREIGN PATENT DOCUMENTS

| CN | 104346437 A | 2/2015 |
| CN | 105593967 A | 5/2016 |

(Continued)

OTHER PUBLICATIONS

A.L. Eberle et al., *Mission (im)possible—mapping the brain becomes a reality*, Microscopy 64 (2014), S. 45-55.
(Continued)

*Primary Examiner* — Jason L McCormack
(74) *Attorney, Agent, or Firm* — Fish & Richardson P.C.

(57) ABSTRACT

A system includes a multi-beam particle microscope for imaging a 3D sample layer by layer, and a computer system with a multi-tier architecture is disclosed. The multi-tier architecture can allow for an optimized image processing by gradually reducing the amount of parallel processing speed when data exchange between different processing systems and/or of data originating from different detection channels takes place. A method images a 3D sample layer by layer. A computer program product includes a program code for carrying out the method.

21 Claims, 8 Drawing Sheets

(58) Field of Classification Search
USPC .......................................... 250/306, 307, 311
See application file for complete search history.

(56) References Cited

U.S. PATENT DOCUMENTS

| | | | |
|---|---|---|---|
| 4,200,794 A | 4/1980 | Newberry | |
| 4,338,548 A | 7/1982 | Bono | |
| 4,742,234 A | 5/1988 | Feldman | |
| 5,215,623 A | 6/1993 | Takahashi | |
| 5,864,142 A | 1/1999 | Muraki | |
| 5,892,224 A * | 4/1999 | Nakasuji | G01N 23/225 |
| | | | 250/397 |
| 5,905,267 A | 5/1999 | Muraki | |
| 5,981,954 A | 11/1999 | Muraki | |
| 6,107,636 A | 8/2000 | Muraki | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,244,949 B2 | 7/2007 | Knippelmeyer | |
| 7,285,779 B2 | 10/2007 | Litman | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 | 10/2015 | Almogy | |
| 9,263,233 B2 | 2/2016 | Zeidler | |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 | 3/2017 | Liu | |
| 9,653,254 B2 | 5/2017 | Zeidler | |
| 9,702,983 B2 | 7/2017 | Eder | |
| 9,922,799 B2 | 3/2018 | Li | |
| 9,991,089 B2 | 6/2018 | Mueller | |
| 10,062,541 B2 | 8/2018 | Ren | |
| 10,141,160 B2 | 11/2018 | Ren | |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 | 3/2020 | Okada | |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler | |
| 10,811,215 B2 | 10/2020 | Zeidler | |
| 10,854,423 B2 | 12/2020 | Sarov | |
| 10,879,031 B2 | 12/2020 | Ren | |
| 10,896,800 B2 | 1/2021 | Riedesel | |
| 2009/0014649 A1 | 1/2009 | Nakasuji | |
| 2012/0025075 A1 | 2/2012 | Moore et al. | |
| 2012/0061565 A1 | 3/2012 | Enyama et al. | |
| 2013/0248731 A1 | 9/2013 | Tanimoto et al. | |
| 2014/0197325 A1 | 7/2014 | Kato | |
| 2015/0348738 A1 | 12/2015 | Zeidler et al. | |
| 2015/0348749 A1 | 12/2015 | Lang et al. | |
| 2017/0084424 A1 | 3/2017 | Masnaghetti et al. | |
| 2017/0117114 A1 | 4/2017 | Zeidler | |
| 2017/0133198 A1 | 5/2017 | Kruit | |
| 2017/0316912 A1 | 11/2017 | Zeidler et al. | |
| 2018/0053627 A1 | 2/2018 | Phaneuf et al. | |
| 2019/0333732 A1 | 10/2019 | Ren | |
| 2020/0027694 A1* | 1/2020 | Wang | G01N 23/2251 |
| 2020/0211810 A1 | 7/2020 | Zeidler | |
| 2020/0243300 A1 | 7/2020 | Zeidler | |
| 2020/0373116 A1 | 11/2020 | Zeidler | |
| 2021/0005423 A1 | 1/2021 | Zeidler | |
| 2021/0035773 A1 | 2/2021 | Zeidler | |

FOREIGN PATENT DOCUMENTS

| | | |
|---|---|---|
| CN | 105765691 A | 7/2016 |
| CN | 105789007 A | 7/2016 |
| CN | 107210176 A | 9/2017 |
| DE | 10 2013 014 976 A1 | 3/2015 |
| DE | 10 2013 016 113 A1 | 3/2015 |
| EP | 2706555 A2 | 3/2014 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014 235883 A | 12/2014 |
| JP | 2014229481 A | 12/2014 |
| TW | 201841190 A | 11/2018 |
| WO | WO 2005/024881 A2 | 3/2005 |
| WO | WO 2007/028595 A2 | 3/2007 |
| WO | WO 2007/060017 A2 | 5/2007 |
| WO | WO2013032949 A1 | 3/2013 |
| WO | WO 2015/181808 A1 | 12/2015 |
| WO | WO 2018/145983 A1 | 8/2018 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

International Search Report and Written Opinion for corresponding PCT Appl No. PCT/EP2020/000012, dated July 121, 2020.
Chinese Office Action, with translation thereof, for corresponding CN Appl No. 2020- 80010820.2, dated Nov. 27, 2023.

* cited by examiner

SYSTEM COMPRISING A MULTI-BEAM PARTICLE MICROSCOPE AND METHOD FOR OPERATING THE SAME

CROSS-REFERENCE TO RELATED APPLICATIONS

The present application is a continuation of, and claims benefit under 35 USC 120 to, international application PCT/EP2020/000012, filed Jan. 14, 2020, which claims benefit under 35 USC 119 of German Application No. 10 2019 000 470.1, filed Jan. 24, 2019. The entire disclosure of these applications are incorporated by reference herein.

FIELD

The present disclosure relates to charged particle beam systems and methods. The present disclosure also relates to a system including a multi-beam particle microscope for imaging a 3D sample and computer system architecture. The present disclosure further relates to a method for imaging a 3D sample layer by layer and a corresponding computer program product. The present disclosure can be suited for reverse engineering of integrated circuits.

BACKGROUND

Single-beam particle microscopes have been known for a long time. In these, a single beam is focused via particle optics onto an object to be examined and scanned over the latter. The particle beam can be an ion beam or an electron beam. Secondary particles, such as e.g. electrons, emitted from a location where the particle beam is incident, are detected and the detected particle intensity is assigned to the locations of the object on which the scanning particle beam is currently directed. Thus, it is possible to generate a particle-optical image of the object. Scanning of a field of view of a particle microscope with the particle beam involves time. The extent of the field of view can be limited. If relatively large parts of the object are intended to be scanned, the object is often moved relative to the particle microscope to scan further fields of view. This in turn involves time. It is generally desirable for particle microscopes to be able to scan many objects and relatively large objects in a shorter time. It is conceivable to provide a larger number of single-beam particle microscopes for such problems, the microscopes operating in parallel to scan a plurality of objects simultaneously. However, this could be a very expensive solution since a dedicated particle microscope with particle optics is provided for each individual particle beam.

Multi-beam particle microscopes may provide a promising approach since a plurality of particle beams is guided jointly through a single particle optics arrangement in order to simultaneously scan the object to be examined with a bundle of particle beams.

A typical application of single-beam particle microscopes as well as of multi-beam particle microscopes is a structure analysis of 3D samples and, for example, reverse engineering. For the structure analysis of a 3D sample, an imaging process and a delayering process can be combined. Imaging of the 3D sample is then done layer by layer. The data gained by imaging a complete stack of layers allows reconstructing a 3D data set of the 3D sample. However, when high resolution is used in imaging, to achieve for example a voxel size in the nanometre regime, huge amounts of data are often to be collected and processed. This can cause very long processing times. For example, when a layer-wise imaging process and a destructive delayering technique are combined, the relatively long processing times can be the bottleneck for reconstruction speed. Here, it is typically desirable for the data collected for one specific layer to be validated before this layer is irreversibly destroyed. It can be a challenge to reduce overhead image processing times such that the data can be validated before the next delayering step.

US 2015/0348749 A1 discloses a multi-beam particle microscope and a method for operating the same wherein large amounts of data are processed.

SUMMARY

The present disclosure seeks to provide a faster system including a multi-beam particle microscope for imaging a 3D sample layer by layer and a corresponding method and computer program product. They technology can be suited for reverse engineering of 3D samples, such as, for example, reverse engineering of integrated circuits.

According to an aspect, the disclosure provides a system that includes a multi-beam particle microscope for imaging a 3D sample layer by layer, and a computer system with a multi-tier architecture. The multi-beam particle microscope includes: a multi-beam source configured to generate a first array of a plurality of first particle beams; first particle optics configured to direct the first particle beams onto an object so that the first particle beams are incident at locations of incidence on the object, which form a second array; a detector including a plurality of detection regions or a plurality of detectors which each have at least one detection region, the detection regions being arranged in a third array, the detector or detectors including a plurality of transducers, a transducer being assigned to each detection region and configured to generate an electrical signal representing a particle intensity incident on the detection region, the plurality of detection regions and the assigned plurality of transducers forming a plurality of detection channels, respectively, the detection channels being assigned to a plurality of detection channel groups; a second particle optics configured to direct second particle beams emitted from locations of incidence in the second array to the third array of detection regions so that each second particle beam is incident on at least one of the detection regions arranged in the third array; and a control computer system for controlling the multi-beam particle microscope. The computer system with the multi-tier architecture includes a first tier including a first plurality of processing systems for processing data, and a second tier including a second plurality of processing systems for processing data. Each processing system of the first plurality of processing systems is configured to receive detection signals exclusively from an assigned detection channel group. The first plurality of processing systems of the first tier is configured to carry out processing of data basically or entirely without any data exchange between different processing systems of the first plurality of processing systems. The second plurality of processing systems of the second tier is configured to receive data from at least one of the plurality of first processing systems of the first tier and is configured to carry out processing of data including a data exchange between different processing systems of the second tier, for example on recently acquired data.

Optionally, the second particle optics is configured such that second particle beams that differ from one another are incident on detection regions that differ from one another. Alternatively, this desired property can be only partly fulfilled.

An element for providing a fast system involves providing the computer system with the multi-tier architecture including the above characteristics. When a computer system includes several processing systems, data processing can be parallelised which can lead to a speed up of the overall processing. However, it is often desirable to also exchange data between different processing systems and this data exchange can lower the overall processing speed significantly. Therefore, it can be generally desirable to reduce (e.g., avoid) data exchange between different processing systems. If the data exchange cannot be avoided, then the data exchange between different processing systems is desirably organised in such a way that the overall processing speed is affected as little as possible. According to the present disclosure, this is achieved by the multi-tier architecture, wherein a data exchange between processing systems in the first tier is basically or entirely avoided and wherein a data exchange between processing systems in the second tier is allowed.

According to the present disclosure, the first plurality of processing systems of the first tier can be configured to carry out processing of data basically or entirely without any data exchange between different processing systems of the first plurality of processing systems. This means that the data exchange between different processing systems is small compared to a total data rate that is processed. Optionally, the data exchange is less than 10% (e.g., less than 5%, less than 1%) of the total data rate that is processed.

Optionally, the first plurality of processing systems of the first tier or/and the second plurality of processing systems of the second tier is configured to carry out real-time processing of data. Optionally, real-time data processing means that the data processing is so fast that it is not necessary to intermediately store data in a non-volatile memory.

Therefore, data processing can be basically as fast as or even faster than the image acquisition process as such.

The charged particles with which the multi-beam particle microscope is operated can be for example electrons, positrons, muons, ions or other charged particles. The disclosed system can be suited for imaging a 3D sample, such as layer by layer 3D imaging; however, it is also possible to image a 2D sample using the systems disclosed herein.

According to the present disclosure, an aspect can involve how different detection to channels are defined and how the data of respective detection channels is processed. The plurality of detection regions and the assigned plurality of transducers form a plurality of detection channels, respectively. In other words, in a simple scenario, imaging a surface with a single particle beam creates data for one detection channel. In more complex scenarios, it is however also possible that imaging with a single particle beam generates is data for several detection channels. Continuing with the simple scenario, imaging a sample with m first particle beams—with m representing a natural number—generates data for at least m detection channels. Data collected via one detection channel with one single particle beam delivers data for a so-called single field of view (sFOV). Data created by the plurality of first particle beams represents the data of a so-called multiple field of view (mFOV). Then, by a relative movement between the second array of beams on the one hand and the 3D sample on the other hand a multiplicity of mFOVs is created which finally altogether can represent a data set of the complete layer of the 3D sample. According to the disclosure, the plurality of detection channels can be assigned to a plurality of detection channel groups wherein data of a respective detection channel group is processed by the same processing system. Optionally, a group includes more than one detection channel. However, it is also possible that a detection channel group includes just one detection channel. In some embodiments, a group includes eight detection channels. It is possible that each group includes the same number of detection channels; however, it is also possible that different groups include different numbers of detection channels.

According to the disclosure, processing of data can be carried out in the first tier basically or entirely without any data exchange between different processing systems and therefore basically or entirely without any exchange of data originating from different detection channels. Respective image processing entails, for example, histogram analysis and/or histogram correction; a detection of overexposed and/or underexposed images; a computation of image sharpness (e.g. by Fourier transformation or edge detection); a computation of a signal to noise ratio (SNR) and/or a computation of a contrast to noise ratio (CNR), e.g. by discrete wavelet transformation (DWT); local feature and/or artifact detection, e.g. slurry particles or scratches; features detection on image for stitching, to combine several sFOVs to form an mFOV; image distortion correction, e.g. by spline interpolation; lossless or lossy data compression, e.g. jpeg2000; contour detection. The image processing listed above can be done for each detection channel separately; there is no information or input involved from another detection channel. Therefore, here, highly parallelised and extremely fast image processing can be carried out basically or entirely without any data exchange of data originating from different detection channels.

According to the present disclosure, processing of data in the second tier can be data processing that includes a data exchange between different processing systems of the second tier, for example on recently acquired data. Optionally, this can mean that for successful image processing of this type a data exchange between different processing systems of the second tier and/or of data originating from different channels is involved. Optionally, the desired data exchange of data originating from different detection channels can include exchange of data originating from neighboured detection channels (or more precisely between neighboured sFOVs), but it is also possible that the data exchange includes data exchange of data originating from different detection channels that are not adjacent to one another. Data processing, for example real-time data processing, in tier 2 can include for example one or more of the following kinds of data processing: stitching between sFOVs and/or stitching between mFOVs; stitching can be based for example on feature detection and/or phase correlation; shading and/or blending; advanced stitching for 3D samples with a high periodicity within one layer, e.g. by long-range phase correlation over many sFOVs and/or mFOVs; brightness correction within a layer; features and/or artifact detection within a layer, such as defects; contour detection, for example contour detection within a layer and/or contour correction, such as contour correction within a layer; and computation of key performance indicators (KPIs) indicating for example how well the last data sets fit in the recently acquired data sets, for example with respect to position and/or histogram and/or with respect to other parameters; local data base comparison.

The data that is exchanged between different processing systems and/or originating from different detection channels in the second tier can represent image data as such and/or meta data of the images, for example, of the sFOVs and/or the mFOVs. The data exchange between different detection channels and/or processing systems can include a respective data exchange on recently acquired data. Optionally, this recently acquired data is data that has been acquired for a respective layer that is currently imaged. In other words, according to some embodiments, the data exchange within the second tier concerns data within a specific layer. Data of one layer can represent a layer data set.

According to some embodiments of the disclosure, the computer system with the multi-tier architecture further includes a third tier with a third plurality of processing systems for processing data, wherein the third plurality of processing systems of the third tier is configured to receive data from at least one of the plurality of second processing systems of the second tier and is configured to carry out processing of data including a data exchange between different processing systems of the third tier, optionally on all existing data. Optionally, the data processing is real-time data processing. Optionally, the data exchange within the third tier includes a data exchange of data belonging to layer data sets of different layers. Therefore, the complexity of data exchange in the third tier is normally higher than in the second tier. However, optionally, the amount of data exchange in the third tier is lower than the amount of data exchange and therefore lower than the network load in the second tier.

According to some embodiments, processing of data in the third tier, optionally real-time data processing includes one or more of the following types of data processing: stitching between layers and/or image position correction; shading and/or blending between layers; global brightness correction, so that the brightness is corrected in the entire 3D data set; global feature and/or artifact detection, e.g. in 3D; contour detection, for example global contour detection and/or contour correction, for example, global contour correction, and/or preparation for rendering; computation of key performance indicators (KPIs) indicating how well the last data set fits into the entire data set, for example with respect to position and/or histogram and/or other parameters; visualisation of the entire 3D data set or of respective parts thereof, optionally waver map visualisation; and/or generation of report files.

According to some embodiments of the disclosure, a processing system includes a central processing unit (CPU), a graphics processing unit (GPU), a field programmable gate array (FPGA) and/or a digital signal processor (DSP) or any combination thereof. The processing system can be a processing system of the first tier, of the second tier or of the third or another tier.

According to some embodiments of the disclosure, the processing system includes a multi-processing unit. Optionally, the multi-processing unit includes multiple CPUs and/or multiple GPUs.

According to some embodiments, at least one processing system of a first plurality of processing systems of the first tier is configured to receive the electric signals from a plurality of transducers and is configured to carry out image processing, such as real-time image processing, for a plurality of detection channels wherein data of the plurality of detection channels is stored in the same memory, for example in the same RAM, of the at least one processing system. Optionally, the memory is a fast main memory and is addressable by one or more processors of the at least one processing system of the first tier. This architecture can contribute to the speed up of overall image processing as well.

According to some embodiments of the disclosure, the plurality of detection channels is assigned to a plurality of detection channel groups wherein data of a respective detection channel group is processed by the same processing system and the assignment of the detection channels to respective detection channel groups is configured to minimize data exchange during image processing between different processing systems based on topological design considerations. According to such embodiments, the detection channels are not just grouped based on construction convenience and space considerations, but the grouping is carried out based on topologic considerations that minimize data exchange between different processing systems and therefore optimize data processing speed. According to some embodiments, different detection channels are assigned to the same processing system, for example to an image acquisition system according to the state of the art. Then, which detection channels are grouped together can be a consideration. It shall be repeated that a decisive parameter for processing speed is the network load generated by data exchange between different processing systems. Therefore, according to some embodiments, by an optimized assignment of specific detection channels to a specific detection channel group processed by one processing system, superfluous network load can be eliminated. Furthermore, if a data exchange of data originating from different detection channels is involved, it can be much faster if this data exchange can be carried out within the same processing system, optionally in the same RAM of one image processing system by default. Further examples for topology optimization in terms of speeding up overall image processing will be given below.

According to some embodiments of the disclosure, the realisation and/or distribution of the first tier, the second tier and/or the third tier is at least partly virtual. Alternatively, the realisation and/or distribution of the first tier, the second tier and/or the third tier is at least partly real. Of course, the realisation of one or more tiers can be completely real as well.

Optionally, the computer system with the multi-tier architecture is configured to carry out pipelining. This can allow for a further speed up of image processing.

According to some embodiments of the disclosure, the first tier is configured to send a feedback signal to the control computer system of the multi-beam particle microscope. It is also possible that several feedback signals are sent. The feedback signal or the feedback signals can for example trigger a certain operation of the multi-beam particle microscope. Alternatively, the feedback signal or the feedback signals can represent a flag for later data inspection in other tiers.

According to some embodiments, the second tier is configured to send a feedback signal to the control computer system of the multi-beam particle microscope and/or to the first tier. Once again, the one or more feedback signals can cause specific operation of the multi-beam particle microscope and/or the at least one feedback signal can set a flag for later data inspection. According to this embodiment, data accuracy can be improved.

According to some embodiments, a feedback signal sent to the control computer system causes immediate re-imaging of at least a part of a layer of the 3D sample with the multi-beam particle microscope. A feedback signal causing immediate re-imaging can be desirable in systems allowing combining imaging of the 3D sample with destructive delayering of the 3D sample. If the data accuracy in a layer data set does not have the desired quality, it is to be avoided that the respective layer of the 3D sample is destroyed before another data set of the respective layer with the desired sufficient quality has been taken. Therefore, a feedback signal causing immediate re-imaging of at least a part of the layer of the 3D sample can be desirable for creating a 3D data set wherein all parts of the 3D data set have the desired data accuracy.

According to some embodiments of the disclosure, the third tier is configured to send at least one feedback signal to the control computer system of the multi-beam particle microscope and/or to the second tier. The feedback signal originating from the third tier can cause different trigger actions. However, optionally, re-imaging of a specific layer is not trigged by this feedback signal, since the data processed within the third tier optionally concerns several layers of the 3D data set, for example layers that have already been destroyed.

According to some embodiments of the disclosure, the claimed system further includes a delayering unit for delayering the 3D sample. Optionally, the delayering unit operates by ion beam milling. However, other delayering methods can also be applied by the delayering unit. Optionally, delayering the 3D sample includes destructive delayering of the 3D sample. Therefore, optionally, a layer of the 3D sample is accurately imaged before the surface is delayered to create the next layer to be imaged. According to an alternative embodiment, the delayering unit operates according to a non-destructive delayering method.

According to an aspect, the disclosure provides a method for imaging a 3D sample layer by layer, for example, a system as described herein. The method includes the following steps: a. delayering a 3D sample, thereby creating a layer of the 3D sample to be imaged; b. imaging the layer of the 3D sample with a multi-beam charged particle microscope, thereby gaining a layer data set; c. checking the validity of the layer data set in real-time; and repeatedly carrying out the steps a. to c. in case of a positive validity.

The method according to the present disclosure can be extremely fast and secure, such as when the system includes the multi-beam particle microscope for imaging a 3D sample and the computer system with the multi-tier architecture as described herein. Furthermore, checking the validity of the layer data set can guarantee that further delayering the 3D sample is carried out only if the already gained layer data set shows the desired data accuracy. Optionally, checking the validity of a layer data set is based on one or more feedback signals sent by the first tier and/or the second tier, either to the control computer system or to the hierarchically higher tier. A feedback signal of the third tier is normally not desirable for deciding whether the current layer can be delayered or not to create the next layer. However, alternative scenarios of the system and of operating the system are possible.

Checking the validity of the layer data set in real-time can mean that checking the validity is carried out fast and does not significantly slow down the entire delayering process. Optionally, checking the validity takes less than 10% (e.g., less than 5%, less than 1%) of the time for data acquisition/ imaging the sample. Alternatively, checking the validity in real-time can be defined by checking the validity in less than 5 minutes (e.g., less than 3 minutes, less than 1 minute). According to some embodiments, checking the validity of the layer data set in real time includes real-time image processing, wherein real-time imaging is defined above with respect to the system computer architecture.

According to some embodiments of the disclosure, checking the validity of the layer data sets triggers an immediate re-imaging of the present layer of the 3D sample in case of non-validity before a next delayering step is performed. This can preclude destroying a layer before a layer data set with a desired validity/accuracy has been gained.

According to some embodiments, checking the validity of the layer data set triggers re-delayering of the 3D sample before a next delayering step is performed. It is for example possible, that the actual delayering was not carried out accurately enough which complicates imaging the respective layer with the desired accuracy. In such a case, re-delayering optionally includes improving the present delayering so that a physical layer with the desired quality can be presented to the multi-beam particle microscope. Typically, in re-delayering a thinner layer of the sample is removed than in delayering such that after re-delayering a physical layer that still shows the same structures as the original layer can be presented to the multi-beam particle microscope. Accordingly, the thickness of the layer to become removed during re-delayering is, for example, at most 50% (e.g., at most 20%, at most 10%) of the thickness of a layer typically to become removed during a delayering process. Alternatively, re-delayering of the 3D sample can include complete delayering of the 3D sample in the sense that another 3D sample of exactly the same type has to be delayered anew.

According to some embodiments of the disclosure, checking the validity of the layer data set triggers recalibrating the multi-beam particle microscope in case of non-validity before a next delayering step is performed. Here, the recalibration can ensure that future imaging operations are performed with the desired accuracy. It is not necessarily the case that data sets already collected are re-taken. However, this can also be done.

According to some embodiments of the disclosure, checking the validity of a layer data set triggers setting a flag for later inspection. The later inspection can be an automatic later inspection or a manual later inspection or a combination thereof.

According to an aspect, the disclosure provides a computer program product with a program code for carrying out the method as described herein. The program code can include several parts and can be programmed in any suitable program language.

It is possible to combine the described embodiments of the disclosure with one another as long as no technical contradictions occur.

BRIEF DESCRIPTION OF THE DRAWINGS

The disclosure will be more fully understood with reference to the attached drawings, in which.

DETAILED DESCRIPTION

Figure 1:
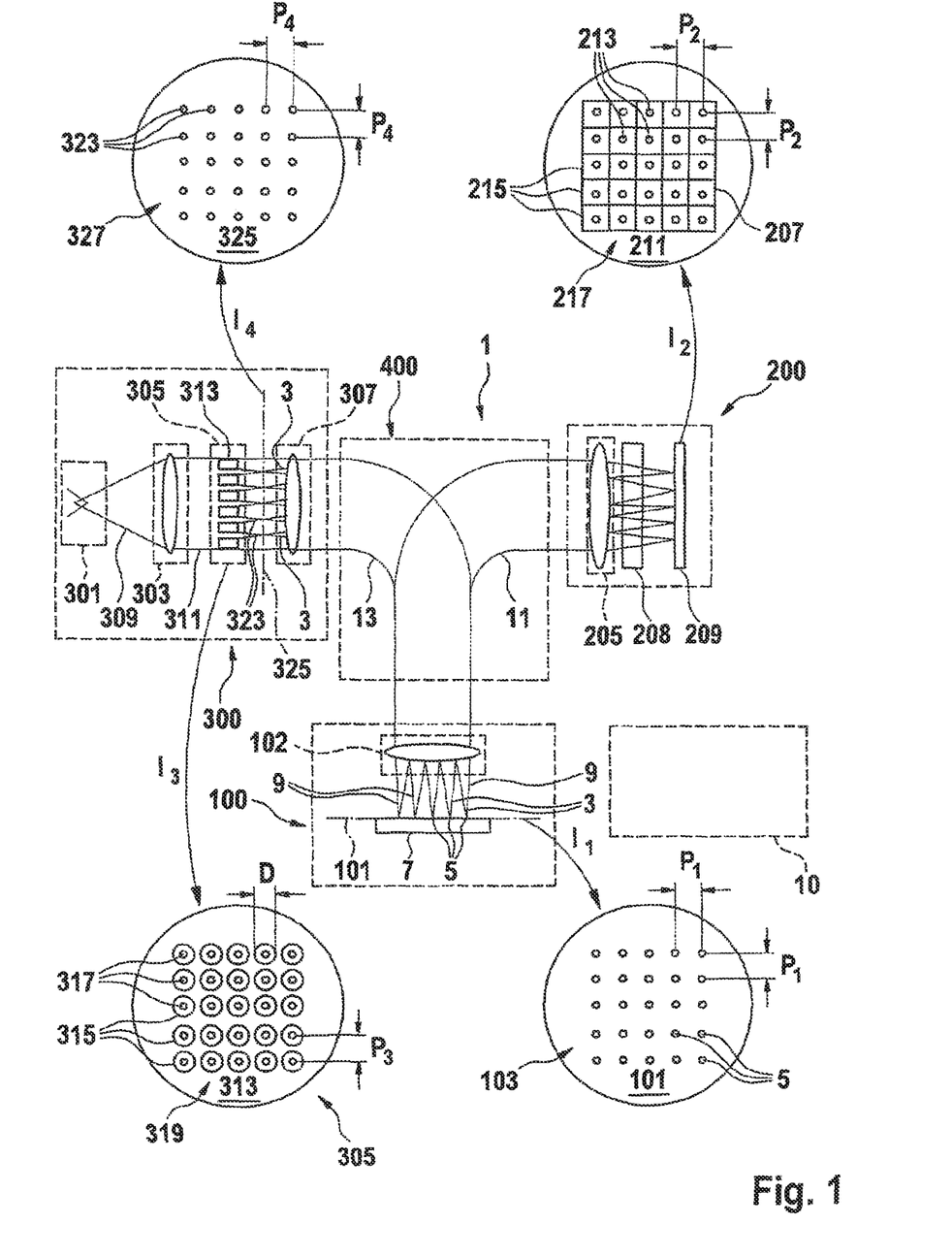
FIG. 1 illustrates an embodiment of a multi-beam charge particle system.

FIG. 1 is a sketch of a particle beam system 1 which employs multiple particle beams. The particle beam system 1 generates multiple particle beams which are incident onto an object to be inspected in order to make electrons emanate from the object and subsequently detect them. The particle beam system 1 is of the scanning electron microscope type (SEM) which employs a plurality of primary electron beams 3 which are incident at locations 5 on a surface of the object 7 where they generate a plurality of electron beam spots. The object 7 to be inspected can be of any desired sort and, for example, include a semiconductor wafer, a biological or materials sample and an arrangement of miniaturized elements or the like. The surface of the object 7 is arranged in an object plane 101 of an objective lens 102 of an objective lens system 100.

The enlarged section $I_1$ of FIG. 1 shows a top view of the object plane 101 with a regular rectangular array 103 of locations of incidence 5 which are formed in the plane 101. The number of the locations of incidence in FIG. 1 is 25, and they form a 5×5 array 103. The number 25 of locations of incidence is a small number selected for reasons of simplified representation. In practice, the number of beams and/or locations of incidence can be selected to be much larger—20×30, 100×100 and the like, by way of example.

In the embodiment represented, the array 103 of locations of incidence 5 is a substantially regular rectangular array with a constant distance $P_1$ between neighboring locations of incidence. Exemplary values of the distance $P_1$ are 1 micrometer, 10 micrometers and 40 micrometers. However, it is also possible for the array 103 to have other symmetries such as, for example, a hexagonal symmetry.

A diameter of the beam spots formed in the object plane 101 can be small. Examples of values of the diameter are 1 nanometer, 5 nanometers, 100 nanometers and 200 nanometers. The focusing of the particle beams 3 for the formation of the beam spots is performed by the objective lens system 100.

The particles incident onto the object, generate electrons which emanate from the surface of the object 7. The electrons emanating from the surface of the object 7 are formed into electron beams 9 by the objective lens 102. The inspection system 1 provides an electron beam path 11 for feeding the multiplicity of electron beams 9 to a detection system 200. The detection system 200 includes electron optics with a projection lens 205 for directing the electron beams 9 onto an electron multi-detector 209.

Section $I_2$ in FIG. 1 shows a top view of a plane 211 in which individual detection regions are lying onto which the electron beams 9 are incident at certain locations 213. The locations of incidence 213 lie in an array 217 at a regular distance $P_2$ from one another. Exemplary values of the distance $P_2$ are 10 micrometers, 100 micrometers and 200 micrometers.

The primary electron beams 3 are generated in a beam generating device 300 which includes at least one electron source 301, at least one collimation lens 303, a multi-aperture arrangement 305 and a field lens 307. The electron source 301 generates a diverging electron beam 309 which is collimated by the collimation lens 303 in order to form a beam 311 which illuminates the multi-aperture arrangement 305.

The section $I_3$ in FIG. 1 shows a top view of the multi-aperture arrangement 305. The multi-aperture arrangement 305 includes a multi-aperture plate 313 which has a plurality of openings or apertures 315 formed therein. The centers 317 of the openings 315 are arranged in an array 319 which corresponds to the array 103 which is formed by the beam spots 5 in the object plane 101. A distance $P_3$ of the centers 317 of the apertures 315 from one another can have, for example, values of 5 micrometers, 100 micrometers and 200 micrometers. The diameters D of the apertures 315 are smaller than the distance $P_3$ of the centers of the apertures. Exemplary values of the diameters D are $0.2 \times P_3$, $0.4 \times P_3$ and $0.8 \times P_3$.

Electrons of the illuminating beam 311 penetrate the apertures 315 and form electron beams 3. Electrons of the illuminating beam 311, which are incident onto the plate 313, are captured by the latter, and do not contribute to formation of the electron beams 3.

Owing to an imposed electrostatic field, the multi-aperture arrangement 305 focuses the electron beams 3 in such a way that beam foci 323 are formed in a plane 325. Alternatively, the beam foci 323 can be virtual foci. A diameter of the foci 323 can be 10 nanometers, 100 nanometers and 1 micrometer, for example. The field lens 307 and the objective lens 102 provide a first imaging particle optics for the purpose of imaging the plane 325, in which the foci are formed, onto the object plane 101 so as to form an array 103 of locations of incidence 5 or beam spots on the surface of the object 7. The objective lens 102 and the projection lens 205 provide a second imaging particle optics for the purpose of imaging the object plane 101 onto the detection plane 211. The objective lens 102 is therefore a lens which is both part of the first and of the second particle optics, while the field lens 307 belongs only to the first particle optics, and the projection lens 205 belongs only to the second particle optics.

A beam switch 400 is arranged in the beam path of the first particle optics between the multi-aperture arrangement 305 and the objective lens system 100. The beam switch 400 also part of the second particle optics in the beam path between the objective lens system 100 and the detection system 200.

Further information relating to such multi-beam inspection systems and components employed therein such as, for example, particle sources, multi-aperture plates and lenses, can be obtained from the International Patent Applications WO 2005/024881, WO 2007/028595, WO 2007/028596 and WO 2007/060017 and the German patent applications with the application numbers DE 10 2013 016 113.4 and DE 10 2013 014 976.2, the content of disclosure of which is incorporated in full in the present application by reference.

The depicted multi-beam particle microscope 1 can be controlled by a control computer system 10. The control computer system 10 can include one or more computers and/or parts. The control computer system 1 can also be connected to a computer system with a multi-tier architecture according to the disclosure which includes for example image acquisition systems (not shown).

Figure 2:
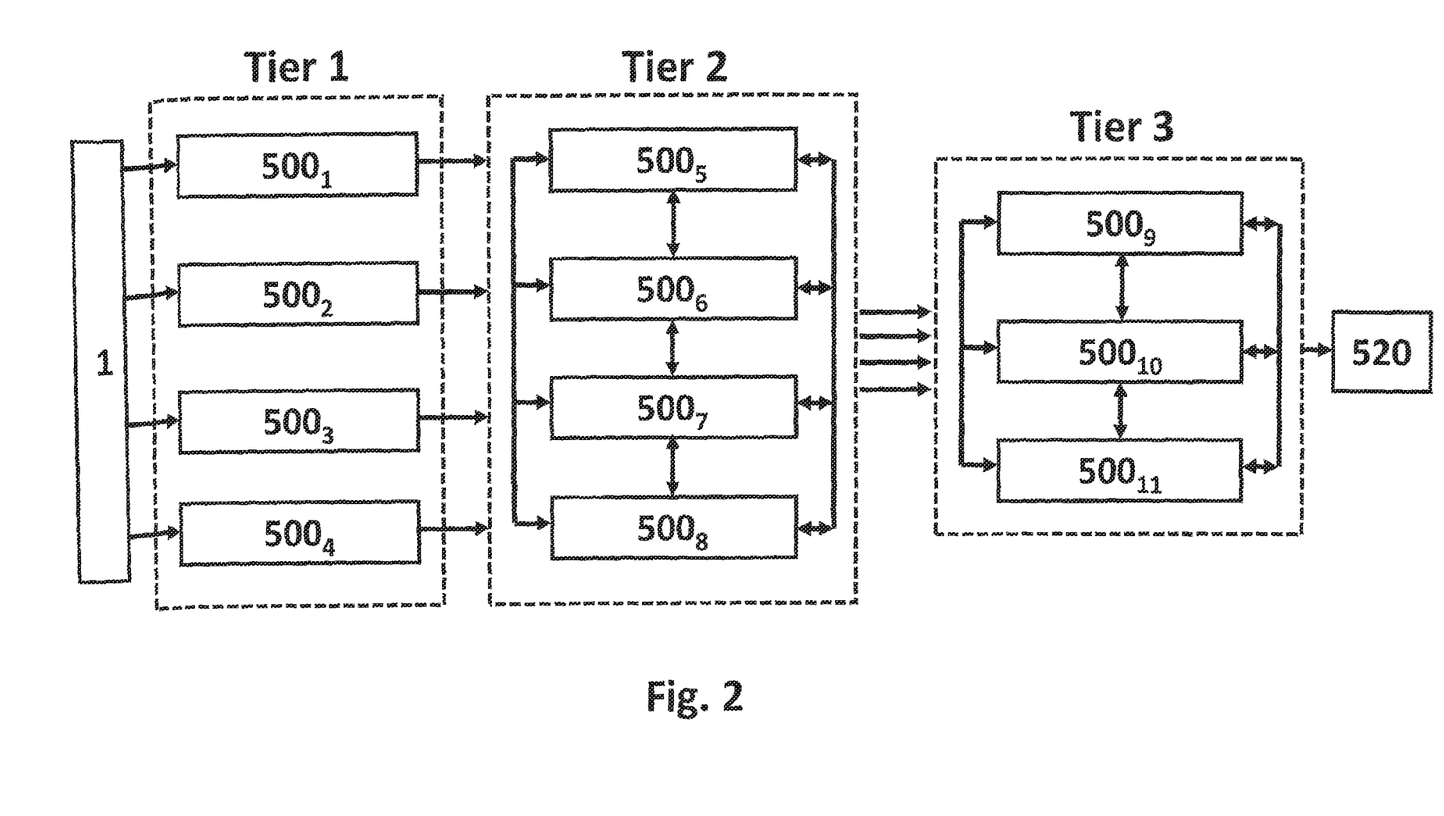
FIG. 2 illustrates a system including a multi-beam particle microscope for imaging a 3D sample layer by layer and a computer system with a multi-tier architecture according to an embodiment.

FIG. 2 is a sketch of a system including a multi-beam particle microscope 1 for imaging a 3D sample layer by layer and a computer system with a multi-tier architecture. The multi-beam particle microscope 1 can be of the type described with respect to FIG. 1. However, it can also be of a different type. The computer system with the multi-tier architecture in the depicted example includes three different tiers that are controlled by a controller (not shown). Data that is generated by a measurement with the multi-beam particle microscope 1 enters tier 1 first. Subsequently, at least part of the data processed in tier 1 is further processed in tier 2. Subsequently, data processed in tier 2 is at least partly sent to tier 3 and it is further processed. The sequence of data processing carried out in tier 1, tier 2 and tier 3 indicates a data flow. However, this does explicitly not exclude that data processing in tier 1, tier 2 and tier 3 is carried out simultaneously on different data. Data processed in tier 3 is accessible via a user interface 520.

In more detail, data from a plurality of detection channels enters tier 1. Tier 1 includes four processing systems $500_1$, $500_2$, $500_3$, and $500_4$. However, the number of four processing systems in tier 1 is just an example. Optionally, the number of processing systems in the first tier is larger, it can be for example 7, 8, 10, 15, 20, 50, 100 or even more processing systems. However, in the depicted example, the number of detection channels is four and so is the number of processing systems in the first tier. The four detection channels are indicated by the arrows starting at the multi-beam particle microscope 1 and entering the plurality of processors $500_1$, $500_2$, $500_3$, and $500_4$ in the first tier. Each of the processing systems $500_1$, $500_2$, $500_3$, and $500_4$ processes data of one detection channel, only. Here, in this simple schematically shown embodiment, a detection channel group also includes only one detection channel. There is no or only very little data exchange in tier 1 between different processing systems processing data originating from different detection channels.

Tier 2 includes four processing systems $500_5$, $500_6$, $500_7$, and $500_8$ which receive data from the processing systems $500_1$, $500_2$, $500_3$, and $500_4$ of the first tier. However, there is no fixed assignment for a data connection between processing systems $500_1$, $500_2$, $500_3$, and $500_4$ of the first tier with processing systems $500_5$, $500_6$, $500_7$, and $500_8$ of the second tier. This is indicated by the arrows ending already at the box of tier 2. In the shown example, the number of processing systems in each tier is four, the number is equal. However, this is not necessarily the case. Optionally, the number of processing systems in the second tier is lower than the number of processing systems in the first tier. This is due to the amount of data processing that is carried out in tier 2 compared to the amount of data processing that is to be carried out in tier 1. Details will be explained later. In tier 2, real-time processing of data is carried out, including a data exchange between different processing systems $500_5$, $500_6$, $500_7$, and $500_8$. This data exchange carried out in tier 2 also includes a data exchange between different detection channels. Optionally, this data exchange between different processing systems $500_5$, $500_6$, $500_7$, and $500_8$ in the second tier which can also include data originating from different detection channels is carried out on a recently acquired data which is optionally data related to a specific layer. Optionally, with the image processing carried out in tiers 1 and 2 all data related to a specific layer can be processed.

The third tier of the computer system with the multi-tier architecture includes a third plurality of processing systems $500_9$, $500_{10}$ and $500_{11}$ for processing data. Tier 3 receives data from tier 2. Optionally, the data flow from a tier to the next tier decreases from tier 1 to tier 3. Within tier 3, the processing systems $500_9$, $500_{10}$ and $500_{11}$ can exchange data with each other. Therefore, in tier 3, data originating from different detection channels can be/is exchanged. Furthermore, this does not only hold for data relating to a specific single layer, but for data relating to a plurality of layers, for example data relating to all layers. Optionally, the data exchange is allowed on all existing data of the collected 3D data set.

The amount of network load caused by data exchange between different processing systems gradually increases from tier 1 to tier 3. A reduction of processing speed results at least partly from this increased data exchange. In the shown embodiment, the fastest data processing is carried out in the first tier with no or almost no data exchange between different channels. Then, in tier 2, a relatively simple data exchange between different processing systems and/or of data originating from different detection channels within one layer is allowed. Finally, within tier 3, a bigger data exchange between different processing systems and/or of data originating from different detection channels and of data belonging to different layers is carried out. A reduction of processing speed can also result from an increased computational load from tier 1 to tier 3 which can for example be the result of more complex calculations. This three tier architecture therefore reflects the basic aspects when imaging a 3D sample layer by layer. However, it is also possible to include a fourth tier, a fifth tier etc. in the multi-tier architecture carrying out specific image processing.

In principle, the processing systems $500_1$ to $500_{11}$ can be of any type, the type can be identical, partly identical or completely different for the different processing systems $500_1$ to $500_{11}$. Optionally, a processing system $500_1$ to $500_{11}$ includes a central processing unit (CPU), a graphics processing unit (GPU), a field programmable gate array (FPGA) and/or a digital signal processor (DSP) or any combination thereof. The realisation and/or distribution of the first tier, the second tier, the third tier or any other tier can be at least partly virtual. Alternatively or additionally, the computer system with the multi-tier architecture can be configured to carry out pipelining. For example, each tier can be subdivided in sub-tiers, optionally for realizing pipelining.

Figure 3:
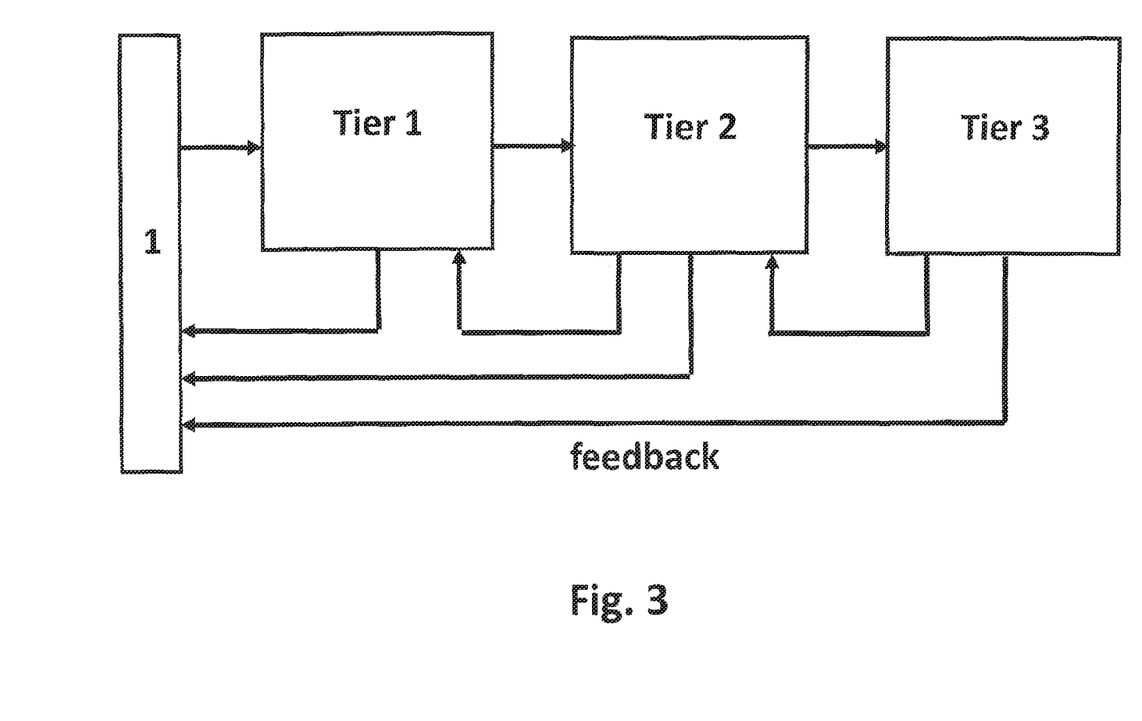
FIG. 3 illustrates an embodiment of implementation of feedback loops.

FIG. 3 is a sketch illustrating the implementation of feedback loops according to an embodiment of the disclosure. The feedback signals are indicated by the arrows in the lower half of FIG. 3. Basically, feedback signals from each tier (here tier 1, tier 2 and tier 3) can be sent to a hierarchically next higher tier and to the multi-beam particle microscope 1. Therefore, tier 1 can deliver a feedback signal back to the multi-beam particle microscope 1, only. Tier 2 can deliver a feedback signal back to tier 1 or/and to the multi-beam particle microscope 1. Tier 3 can deliver a feedback signal to tier 2 and to the multi-beam particle microscope 1.

The feedback signals are indicated by the arrows in the lower half of FIG. 3.

The feedback delivered from tier 1 back to the multi-beam particle microscope 1 can address one or more of the following topics: the brightness and/or contrast in a single beam or in all beams is desired to be readjusted; a focus and/or stigmation readjustment is desired; the contrast in imaging is insufficient; and the contour and/or artifact detection is faulty.

Accordingly, the following actions can be triggered by the feedback signal of tier 1: According to some embodiments, an immediate retake of an image can be triggered. It is for example possible to retake an image immediately when the stage is still at the current position at which the image data caused a flag signal. The retake at a later point in time is more time consuming because the stage is moved again and additionally the correct position for retaking is to be found. It is also possible that an image or images are flagged for later inspection in tier 2 or/and tier 3. If there are too many artifacts in the images, re-delayering should be considered and/or automatically carried out. If the data does not fit well into the context, e.g. if poor stitching results are detected, the feedback signal can indicate that it is desirable to recalibrate the multi-beam particle microscope 1.

Tier 2 can send feedback to tier 1 and/or the multi-beam particle microscope 1. The feedback can for example concern information about one or more of the following aspects: the brightness and/or contrast of a single beam, several beams or all beams is to be readjusted; and a focus and/or stigmation readjustment is desired.

If the feedback signal triggers an action, these actions can include one or more of the following: immediate retake of one or more images; flag regions for later inspection in tier 3 or via user; flag image or flag images for later inspection in tier 3; re-delayering should be considered because there are too many artifacts; data does not fit well in data context and/or data base—flag to user; stitching is faulty—recalibrate the multi-beam particle microscope 1; contour detection is faulty—recalibrate multi-beam particle microscope and/or change delayering parameters; and delayering artifacts are visible—re-delayer and/or change delayering parameters.

Tier 3 can send feedback to tier 2 and/or the multi-beam particle microscope 1. Possible trigger actions include one or more of the following: image position correction is to be readjusted; flag image or flag images for later inspection by user; re-delayering should be considered—too many artifacts; data does not fit well into data context/data base—flag to user; 3D stitching faulty, recalibrate multi-beam particle microscope 1; contour detection and/or rendering faulty— recalibrate multi-beam particle microscope 1 and/or change delayering parameters; and delayering artifacts visible—re-delayer and/or change delayering parameters.

Other feedback signals and/or trigger actions are also possible.

Tiers 1, 2 and 3 and their respective processing systems are controlled by a controller CTRL. The controller controls data processing operations, for example data corrections carried out in tier 1, tier 2 and/or tier 3. For example, the data corrections can be switched on and off individually. Instead of providing a separate controller, the control function for the tiers 1, 2 or/and 3 can be integrated in another computer or processing system, for example into a processing system of tier 1. Alternatively, the control function can be integrated in a control computer system 10 for controlling the multi-beam particle microscope 1 (see FIG. 4).

Figure 4:
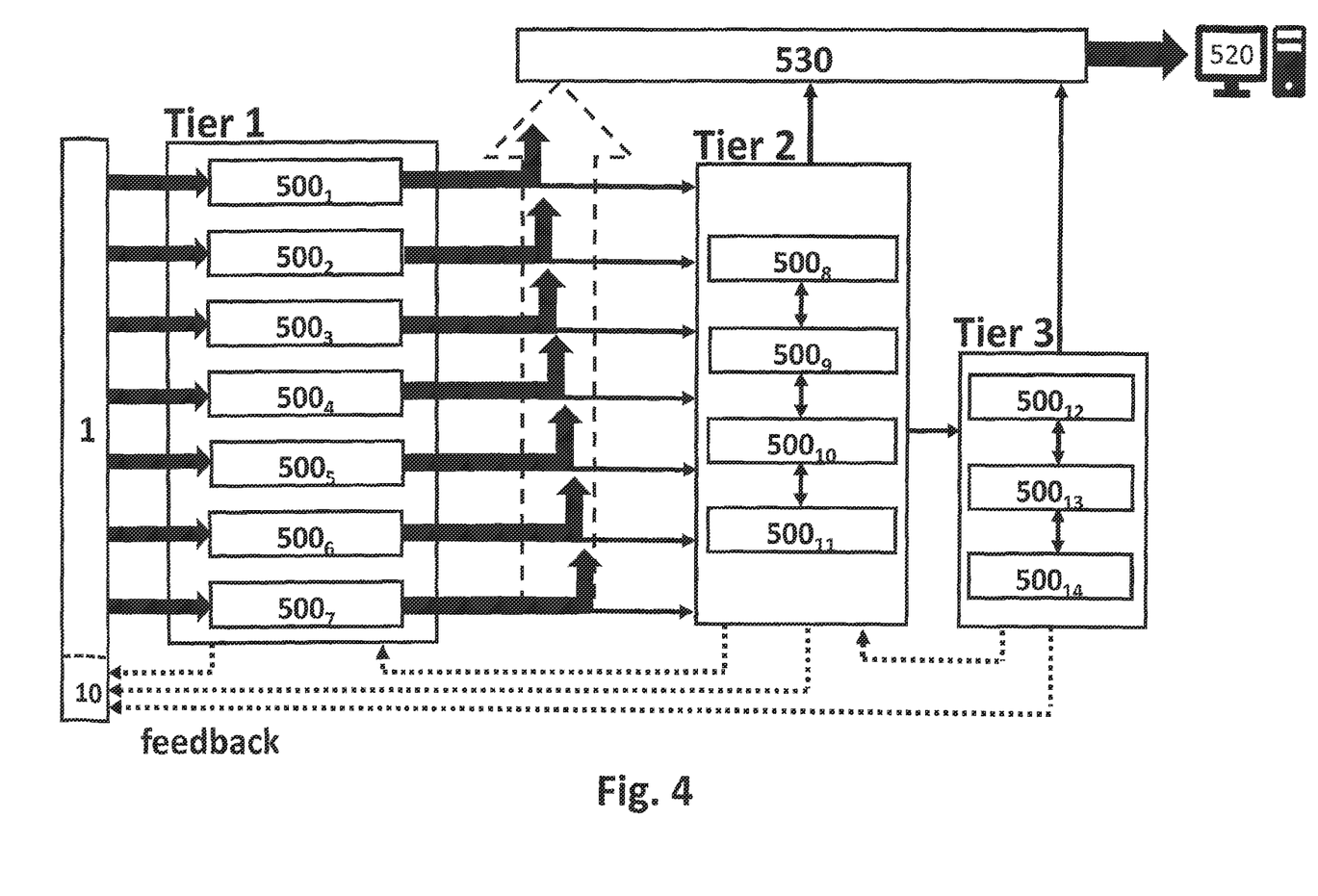
FIG. 4 illustrates a system including a multi-beam particle microscope for imaging a 3D sample layer by layer and a computer system with a multi-tier architecture according to an embodiment.

FIG. 4 is a sketch of an embodiment of the system including a multi-beam particle microscope 1 and a computer system with a multi-tier architecture including three tiers. The embodiment depicted in FIG. 4 is a combination of the aspects of the disclosure already depicted and described with respect to FIG. 2 (multi-tier architecture) and FIG. 3 (feedback signals). Additionally, FIG. 4 illustrates the amount of network load/data flow in the entire system. The amount of data is indicated by the thickness of the arrows in FIG. 4. Thick arrows indicate a big amount of data, narrower arrows indicate a smaller amount of data. For grounds of completeness, the storage 530 for the finally processed data is also shown.

The amount of data delivered from the multi-beam particle microscope 1 to the processing systems $500_1$ to $500_7$ of tier 1 is huge. In tier 1, parallel processing of the data is carried out with no exchange of data between different processing systems and/or detection channels. Most of the data that was processed in tier 1 directly goes into the storage 530. Data rates for writing into the storage 530 can reach ten or more of gigabytes per second. The amount of data in this storage 530 is correspondingly huge. It can be in the order of magnitude of several ten petabyte.

Part of the data of tier 1 is sent to tier 2 and its processing systems $500_8$ to $500_{11}$. Here, a data exchange between different processing systems $500_8$ to $500_{11}$ including exchange of data originating from different detection channels is carried out. Then, once again, part of the data processed in tier 2 directly goes into the storage 530. A remaining part of the data is delivered to tier 3 with three processing systems $500_{12}$ to $500_{14}$. Here, data exchange between different processing systems is allowed and also includes a processing of data originating from different detection channels and on top data exchange between layer data sets belonging to different layers of the 3D data set depicting the 3D sample. Having been processed in tier 3, the remaining data enters the storage 530. A user interface 520 has access to the storage 530 and the data can be further investigated.

Additionally, the feedback loops are depicted in FIG. 4 going back to the previous tier and/or going directly back to the multi-beam particle microscope 1, and here more precisely to the control computer system 10 for controlling the multi-beam particle microscope 1. It is also possible that the control computer system 10 is provided at a distance from the multi-beam particle microscope 1 and/or it can be included in a hardware used for the image processing carried out in tiers 1, 2 and 3. Again, it has to be born in mind, that a realisation of tiers 1, 2 and 3 can also be at least partly virtual.

Figure 5:
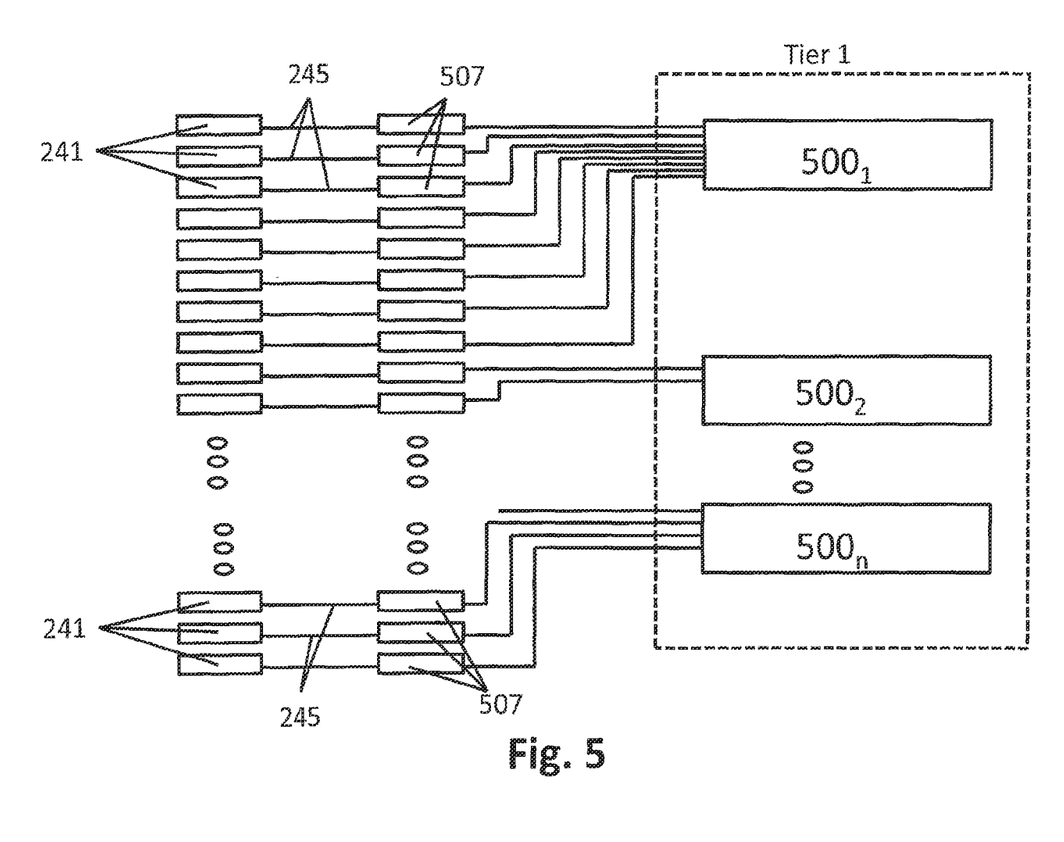
FIG. 5 illustrates detection channel grouping.

FIG. 5 shows a sketch illustrating detection channel grouping. Here, each processing system $500_1$ to $500_n$ of tier 1 receives data from a plurality of a detection channels, respectively. In the example shown, eight detection channels are grouped together and deliver the input for 1 processing system $500_1$ to $500_n$, respectively. For completeness, the origin of the data of the detection channels is also schematically shown: the detection system 200 of the multi-beam particle microscope 1 can include particle detectors as well as light detectors. It is very common to convert signals from particle detectors into light and then to detect light with respective light detectors for each detection channel. FIG. 5 indicates respective light detectors 241 assigned to detection regions. The light detectors 241 can for example be embodied by Avalanche photo diodes (APDs). The light detectors 241 emit electric signals via signal lines 245 which are connected to frame grabbers 507. The frame grabbers 507 respectively generate image information by virtue of converting detected particle intensity into grey values of an image and assigning these to a location in the image. The image information is two-dimensional and can be stored in a linear data storage mechanism in a column by column or line by line manner in order to subsequently be addressable. The image information for each one of the detected images is transmitted from the frame grabbers 507 to the processing systems $500_1$ and $500_n$ and is written there directly into the main memory. A light detector 241 and a frame grabber 507 provide an example for a transducer. A transducer is assigned to each detection region and configured to generate an electrical signal representing a particle intensity incident on the detection region. Other detections systems including other kinds of transducers are also possible, for example detectors including barrier layers wherein electron/hole pairs are created.

The plurality of processing systems $500_1$ and $500_n$ of tier 1 therefore provides an image recording computer system. In the depicted example, the number of frame grabbers 507 connected to each one of the processing systems $500_1$ and $500_n$ in the first tier is such that the image data generated by the plurality of frame grabbers 507 can be processed by the processing systems $500_1$ and $500_n$ in real time. In the depicted exemplary embodiment, up to eight frame grabbers 507 are connected to one processing system 500. Each of the processing systems $500_1$ and $500_n$ has a fast memory, in which the image data generated by the frame grabbers 507 are stored for further processing. Optionally, the image processors $500_1$ and $500_n$ include multi-processing units and all multi-processing units in 1 processing system $500_1$ and $500_n$ can address the main memory within the respective processing system $500_1$ and $500_n$. Image processing within the same processing system is quite fast, and even if it's desirable to exchange data between different detection channels this exchange can be carried out comparatively fast if the data representing the respective detection channels is stored in the same memory, for example in the same RAM of a processing system 500. Therefore, how different detection channels are grouped together and how they are assigned to a specific processing system 500 influence the possible processing speed. According to the disclosure, this finding can be implemented when the multi-tier architecture is realised at least partly virtual. This means, that hardware processing systems 500 can represent parts of tier 1 and parts of tier 2 at the same time. Data processing in common image processing systems can be carried out in a virtual tier architecture; still, the physical assignment of detection channels to a hardware processing system is of importance in order to optimize processing speed. The concept of grouping channels together will be further explained by giving reference to FIGS. 6 to 8.

Figure 6:
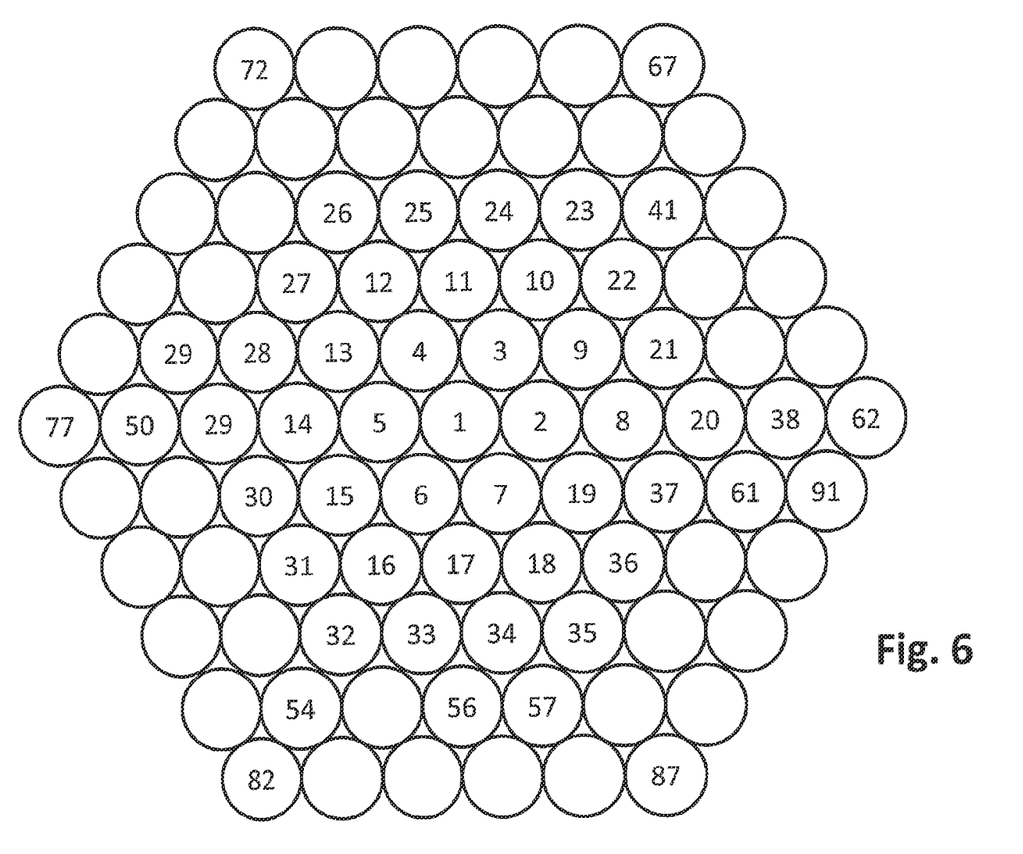
FIG. 6 illustrates a multi-field of view (mFOV) with 91 single fields of view (sFOVs)

FIG. 6 is a simple sketch illustrating a multi-field of view (mFOV) with 91 single fields of view (sFOVs). In principle, the numbering of these sFOVs is arbitrary. In the depicted example, the central sFOV is labelled with 1. Around this central sFOV No 1 a shell with six more sFOVs 2 to 7 is shown. The next shell includes sFOVs 8 to 19 etc. Overall, a hexagonal structure with 91 sFOVs is shown creating one mFOV.

Figure 7:
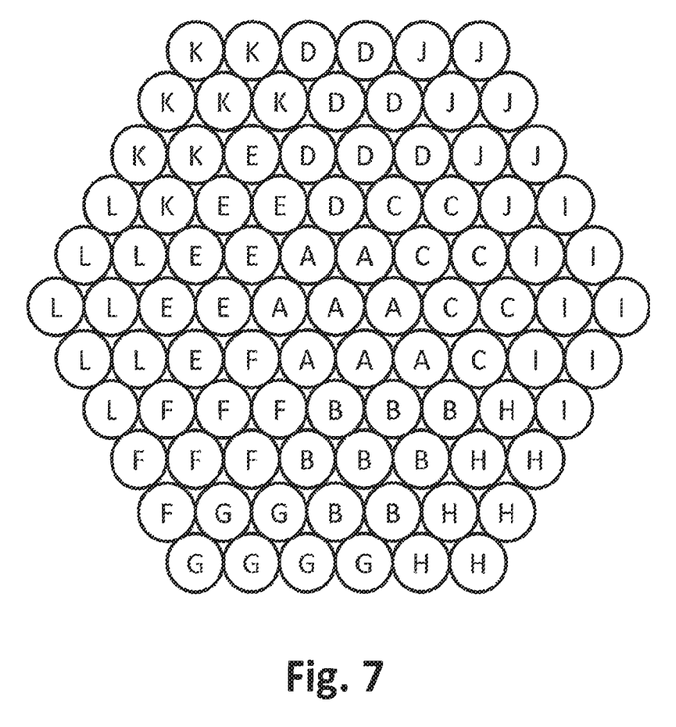
FIG. 7 illustrates optimized detection channel groups within one mFOV.

FIG. 7 is a sketch illustrating an optimized detection channel grouping within one mFOV with 91 sFOVs. Different groups of detection channels are labelled with different letters. In the present example with 91 sFOVs, 12 groups A to L are depicted. Data of each detection channel group is processed by the same processing system 500 in tier 1 and/or tier 2. The assignment of detection channels to the respective detection channel groups A to L is configured to reduce data exchange during image processing between different image processing systems based on topologic design considerations. Optionally, the rules for optimizing the grouping are as follows: group the detectors in the multi-field of view mFOV such that as much data transfer between two or more detection channels as possible takes place inside one processing system/acquisition system 50; as little data transfer as possible between different detection channels takes place between any two processing systems/image acquisition systems 500; and topology optimization—make the ratio of the "area" (this is the number of detectors on one processor/image acquisition system 500) versus "circumference" (this is the number of detectors having a neighbour detector on a different processing system/image acquisition system 500) as large as possible.

The grouping depicted in FIG. 7 is a good one if up to 8 detection channels can be is processed by one processing system 500 in the first tier and/or the second tier. Other solutions also exist.

Taking into consideration that the image of a complete layer of the 3D sample is built up by a plurality of mFOVs, it is possible that additional topological design considerations are considered as well. For example, which detection channels of different mFOVs have to be paired for a data exchange, for example for stitching procedures within a layer, can be a consideration. A pairing can be based on topological design considerations in order to reduce a data exchange between different processing systems and therefore the network load which results in a faster overall image processing speed.

Figure 8:
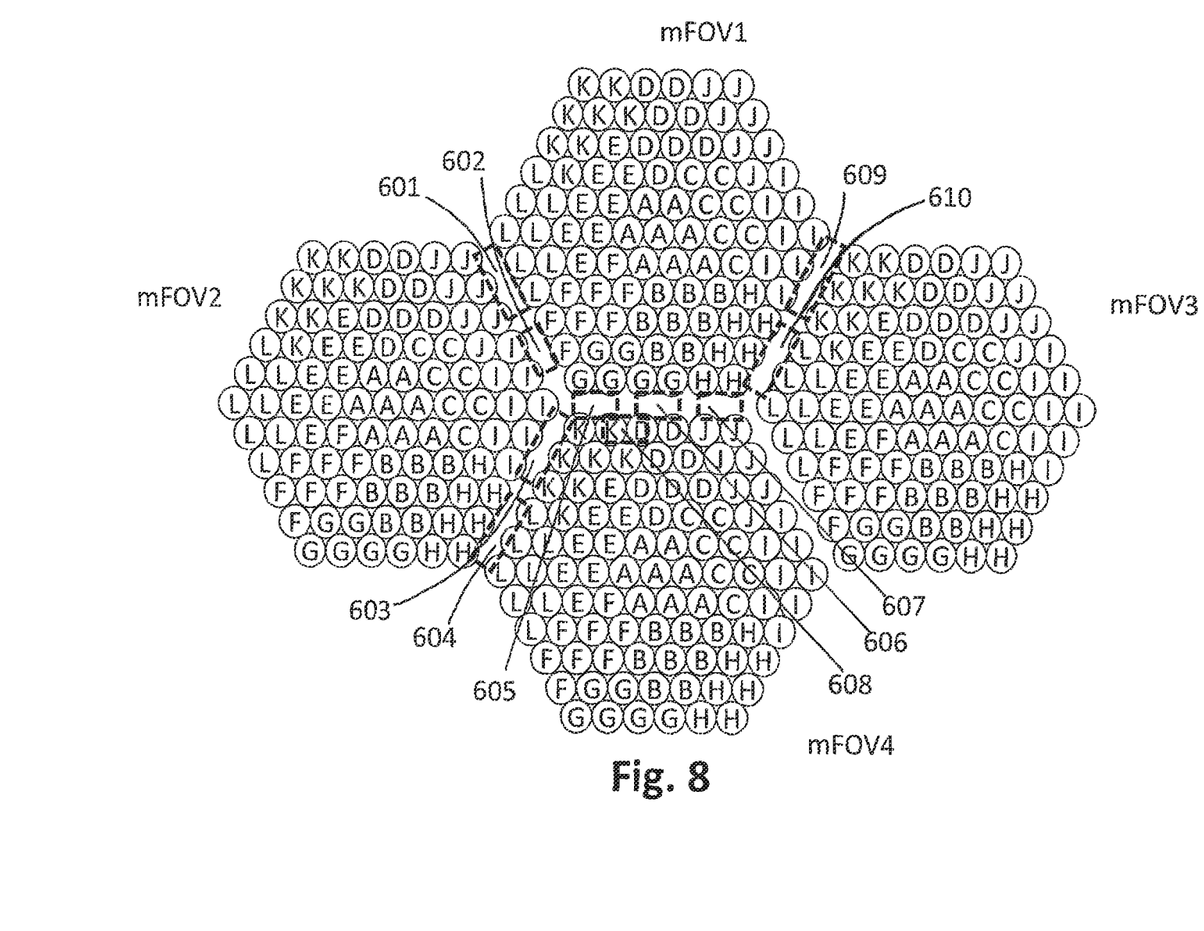
FIG. 8 illustrates optimized detection channel groups between mFOVs.

A solution for such a scenario is depicted in FIG. 8. FIG. 8 is a sketch illustrating detection channel groups of mFOVs. Four mFOVs 1 to 4 are illustrated and the neighbour relationships of sFOVs are shown when the stage is moved. At the border between mFOV1 and mFOV2, the detection channel group L of mFOV1 has three detection channels on the outmost position, each facing detection channels belonging to detection channel group J on mFOV2. This grouping is indicated by the box 601.

Similarly, the two detection channels of mFOV1 belonging to detection channel group F face two detection channels belonging to detection channel group I on mFOV2 which is indicated by box 602. Furthermore, three detection channels belonging to detection channel group H on mFOV1 situated at the border to mFOV3 face three detection channels belonging to detection channels group L on mFOV3 which is indicated by box 610. Three detection channels belonging to detection channel group I of mFOV1 face three detection channels belonging to detection channel group K on mFOV3 which is indicated by box 609. Reference signs 603 to 608 also indicate boxes for illustrating pairing of detection channel groups between different mFOVs. The data exchange between different processing systems can thus be reduced by making the boxes containing pairs of neighbouring detection channels that belong to maximum one or two different detection channel groups as large as possible.

The only more complex region in terms of pairing in the depicted example with 91 sFOVs is around the region 608. Here, in mFOV4, detection channels 70 and 71 (using the numbering shown in FIG. 6) belong to different detection channel groups D and K. Still, on neighboured mFOV1, detection channels 83 and 84 both belong to detection channel group G.

What is claimed is:
1. A system, comprising:
i) a multi-beam particle microscope configured to image a 3D sample, the multi-beam particle microscope comprising:
a) a multi-beam source configured to generate a first array of a plurality of first particle beams;
b) first particle optics configured to direct the first particle beams onto an object so that the first particle beams are incident at locations of incidence on the object, which define a second array;
c) a member selected from the group consisting of a detector comprising a plurality of detection regions and a plurality of detectors which each have at least one detection region, the detection regions being arranged in a third array, the member comprising a plurality of transducers, a transducer being assigned to each detection region and configured to generate an electrical signal representing a particle intensity incident on the detection region, the plurality of detection regions and the assigned plurality of transducers defining a plurality of detection channels, respectively, the detection channels being assigned to a plurality of detection channel groups;

d) second particle optics configured to direct second particle beams emitted from locations of incidence in the second array to the third array of detection regions so that each second particle beam is incident on at least one of the detection regions arranged in the third array; and e) a controller configured to control the multi-beam particle microscope; and ii) a computer system, comprising:

a) a first tier comprising a first plurality of processing systems configured to process data; and b) a second tier comprising a second plurality of processing systems configured to process data, wherein:

each processing system of the first plurality of processing systems is configured to receive detection signals exclusively from an assigned detection channel group;

the first plurality of processing systems is configured to process data basically or entirely without any data exchange between different processing systems of the first plurality of processing systems;

the second plurality of processing systems is configured to receive data from at least one of the plurality of first processing systems; and the second plurality of processing systems is configured to process data comprising a data exchange between different processing systems of the second tier.

2. The system of claim 1, wherein:

the computer system further comprises a third tier which comprises a third plurality of processing systems configured to process data;

the third plurality of processing systems is configured to receive data from at least one of the plurality of second processing systems; and the third plurality of processing systems is configured to process data comprising a data exchange between different processing systems of the third tier.

3. The system of claim 2, wherein the third tier is configured to send a feedback signal to at least one member selected from the group consisting of the controller and to the second tier.

4. The system of claim 2, wherein the system is configured to provide:

at least partly virtual realization of at least one member selected from the group consisting of the first tier, the second tier, and the third tier; and/or at least partly virtual distribution of at least one member selected from the group consisting of the first tier, the second tier, and the third tier.

5. The system of claim 1, wherein at least one of processing system selected from the group consisting of the first plurality of processing systems and the second plurality of processing systems comprises at least one member selected from the group consisting of a central processing unit, a global processing unit, a field programmable gate array, and a digital signal processor.

6. The system of claim 1, wherein at least one of processing system selected from the group consisting of the first plurality of processing systems and the second plurality of processing systems comprises a multiprocessing unit.

7. The system of claim 1, wherein:

at least one of the first plurality of processing systems is configured to receive the electric signals from a plurality of transducers and is configured to image process for a plurality of detection channels; and data of the plurality of detection channels is stored in a memory of the at least one first plurality of processing systems.

8. The system of claim 1, wherein the assignment of detection channels to respective detection channel groups is configured, based on topologic design considerations, to minimize data exchange between different processing systems during image processing.

9. The system of claim 1, wherein the computer system is configured to pipeline.

10. The system of claim 1, wherein the first tier is configured to send a feedback signal to the controller.

11. The system of claim 1, wherein the second tier is configured to send a feedback signal to at least one member selected from the group consisting of the controller and the first tier.

12. The system of claim 11, wherein the system is configured so that the feedback signal sent to the controller causes immediate re-imaging of at least a part of a layer of the 3D sample with the multi-beam particle microscope.

13. The system of claim 1, further comprising a delayering unit configured to delayer the 3D sample.

14. The system of claim 1, wherein the first plurality of processing systems is configured to process data so data exchange between different processing systems of the first plurality of processing systems is less than 10% of a total data rate that is processed.

15. The system of claim 1, wherein:

the computer system further comprises a third tier which comprises a third plurality of processing systems configured to process data;

the third plurality of processing systems is configured to receive data from at least one of the plurality of second processing systems;

the third plurality of processing systems is configured to process data comprising a data exchange between different processing systems of the third tier; and at least one of processing system selected from the group consisting of the first plurality of processing systems, the second plurality of processing systems and the third plurality of processing systems comprises at least one member selected from the group consisting of a central processing unit, a global processing unit, a field programmable gate array, and a digital signal processor.

16. The system of claim 1, wherein:

the computer system further comprises a third tier which comprises a third plurality of processing systems configured to process data;

the third plurality of processing systems is configured to receive data from at least one of the plurality of second processing systems; and at least one of processing system selected from the group consisting of the first plurality of processing systems, the second plurality of processing systems and the third plurality of processing systems comprises a multiprocessing unit.

17. The system of claim 1, wherein:

the computer system further comprises a third tier which comprises a third plurality of processing systems configured to process data;

the third plurality of processing systems is configured to receive data from at least one of the plurality of second processing systems;

at least one of the first plurality of processing systems is configured to receive the electric signals from a plurality of transducers and is configured to image process for a plurality of detection channels; and data of the plurality of detection channels is stored in a memory of the at least one first plurality of processing systems.

18. The system of claim 1, wherein:

the computer system further comprises a third tier which comprises a third plurality of processing systems configured to process data;

the third plurality of processing systems is configured to receive data from at least one of the plurality of second processing systems; and the assignment of detection channels to respective detection channel groups is configured, based on topologic design considerations, to minimize data exchange between different processing systems during image processing.

19. The system of claim 1, wherein:

the computer system further comprises a third tier which comprises a third plurality of processing systems configured to process data;

the third plurality of processing systems is configured to receive data from at least one of the plurality of second processing systems; and the computer system is configured to pipeline.

20. The system of claim 1, wherein:

the computer system further comprises a third tier which comprises a third plurality of processing systems configured to process data;

the third plurality of processing systems is configured to receive data from at least one of the plurality of second processing systems; and the first tier is configured to send a feedback signal to the controller.

21. The system of claim 1, wherein:

the computer system further comprises a third tier which comprises a third plurality of processing systems configured to process data;

the third plurality of processing systems is configured to receive data from at least one of the plurality of second processing systems; and the second tier is configured to send a feedback signal to at least one member selected from the group consisting of the controller and the first tier.

* * * * *